United States Patent [19]
Ammo et al.

[11] Patent Number: 5,830,799
[45] Date of Patent: Nov. 3, 1998

[54] METHOD FOR FORMING EMBEDDED DIFFUSION LAYERS USING AN ALIGNMENT MARK

[75] Inventors: Hiroaki Ammo; Shigeru Kanematsu, both of Kanagawa; Takayuki Gomi, Tokyo, all of Japan

[73] Assignee: Sony Corporation, Japan

[21] Appl. No.: 700,081

[22] Filed: Aug. 20, 1996

[30] Foreign Application Priority Data

Aug. 25, 1995 [JP] Japan ..................................... 7-216871

[51] Int. Cl.⁶ .................................................. H01L 27/06
[52] U.S. Cl. ........................ 438/401; 438/322; 438/370; 438/432; 438/444; 438/526; 438/975; 148/DIG. 102
[58] Field of Search .................................... 438/401, 444, 438/432, 526, 322, 370, 160, 165, 229, 234, 435, 975; 148/DIG. 102

[56] References Cited

U.S. PATENT DOCUMENTS

| | | | |
|---|---|---|---|
| 4,125,418 | 11/1978 | Vinton ............................ | 148/DIG. 102 |
| 4,412,376 | 11/1983 | Debar et al. . | |
| 4,435,896 | 3/1984 | Parrillo et al. . | |
| 4,573,257 | 3/1986 | Hulseweh ....................... | 148/DIG. 102 |
| 5,294,556 | 3/1994 | Kawamura .............................. | 437/924 |
| 5,300,797 | 4/1994 | Bryant et al. ........................... | 257/206 |
| 5,316,966 | 5/1994 | Van Der Plas et al. ........ | 148/DIG. 102 |
| 5,482,893 | 1/1996 | Okabe et al. ................... | 148/DIG. 102 |
| 5,503,962 | 4/1996 | Caldwell ................................. | 430/317 |

FOREIGN PATENT DOCUMENTS

| | | | |
|---|---|---|---|
| 0 091 256 | 10/1983 | Japan . | |
| 0158519 | 9/1984 | Japan ........................... | 148/DIG. 102 |
| 0004019 | 1/1989 | Japan ..................................... | 437/924 |
| 0 435 331 | 7/1991 | Japan . | |
| 405182885 | 7/1993 | Japan ..................................... | 437/924 |

*Primary Examiner*—John Niebling
*Assistant Examiner*—Long Pham
*Attorney, Agent, or Firm*—Ronald P. Kananen

[57] ABSTRACT

To form NPN and PNP transistors on the same base for example to obtain a complementary bipolar transistor it has been necessary to make an epitaxial layer a thick film, and this has resulted in deterioration of the characteristics of the NPN transistor. Also, because a step of forming an alignment mark has been necessary this has increased the number of manufacturing steps needed to make a complementary bipolar transistor. This invention provides a semiconductor device manufacturing method which solves this problem as follows: After a first opening 13 (alignment mark 16) and a second opening 14 are formed in an insulating film 12 formed on a semiconductor base 11 and a doping mask 15 is then formed on the semiconductor base 11, a third opening 17 is formed thereon with the alignment mark 16 as a reference. After an impurity 18 is introduced into the semiconductor base 11 through the third opening 17, the doping mask 15 is removed and after that an impurity 19 is introduced into the semiconductor base 11 by solid-phase diffusion through the second opening 14 and a first embedded diffusion layer 20 is thereby formed and at the same time the impurity 18 is caused to diffuse and form a second embedded diffusion layer 21. Then, after an epitaxial layer is formed, an impurity diffusion layer is formed therein by ion injection (not shown).

8 Claims, 14 Drawing Sheets

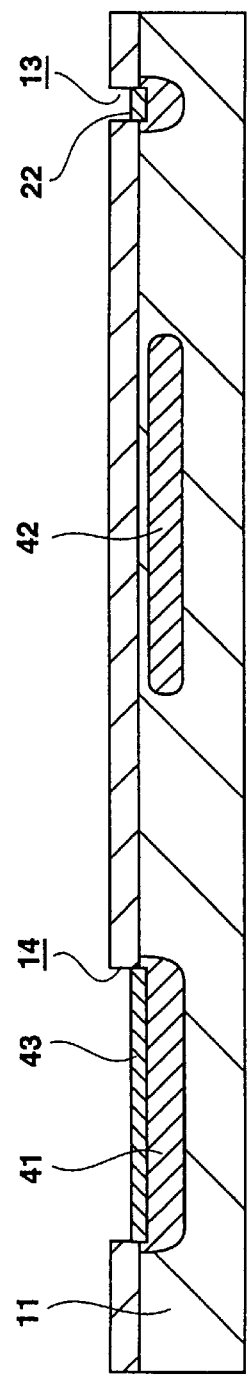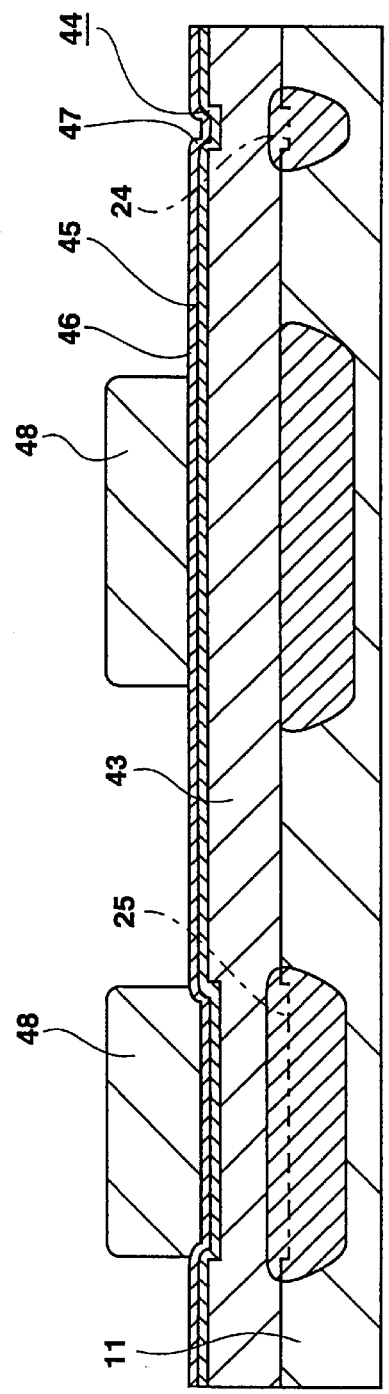
FIG. 9A
FIG. 9B

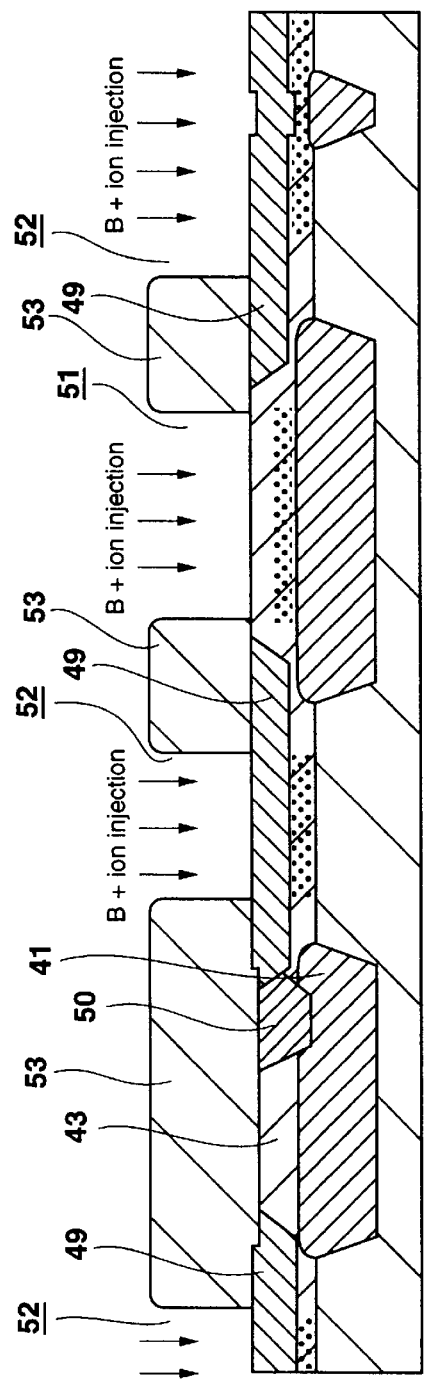
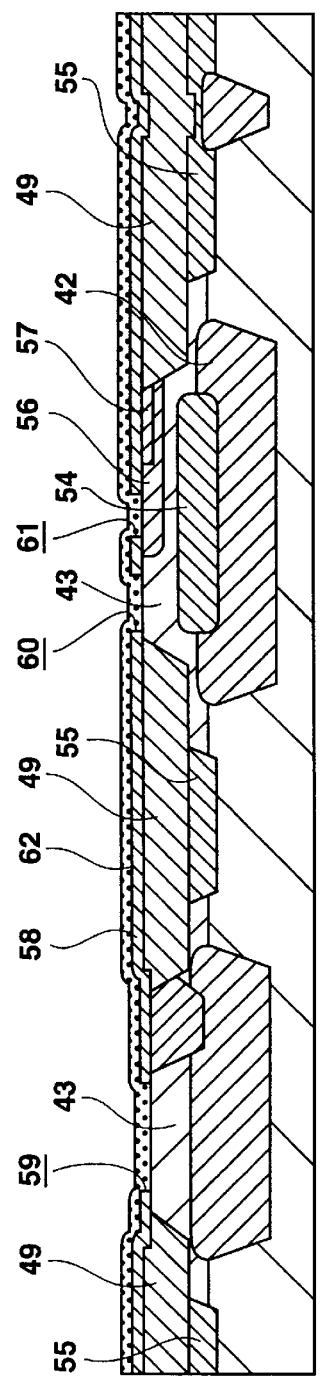
FIG. 10A
FIG. 10B

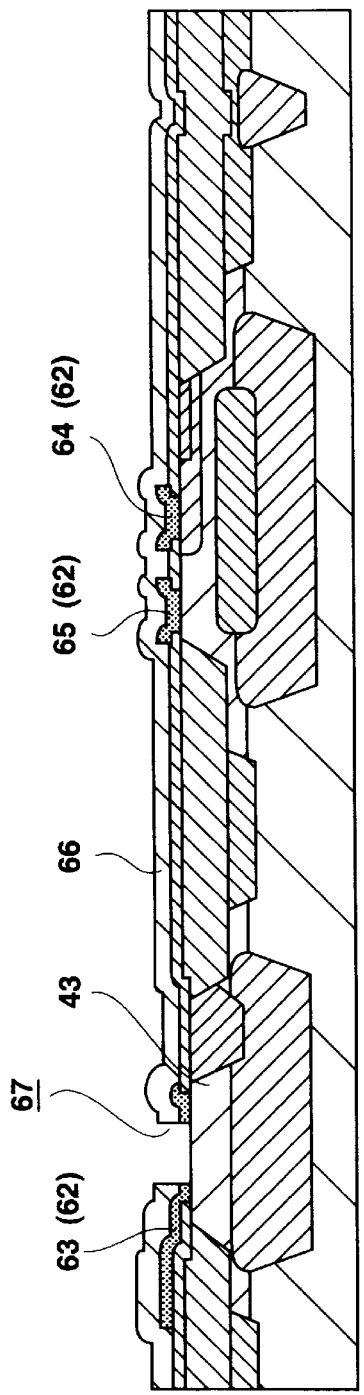
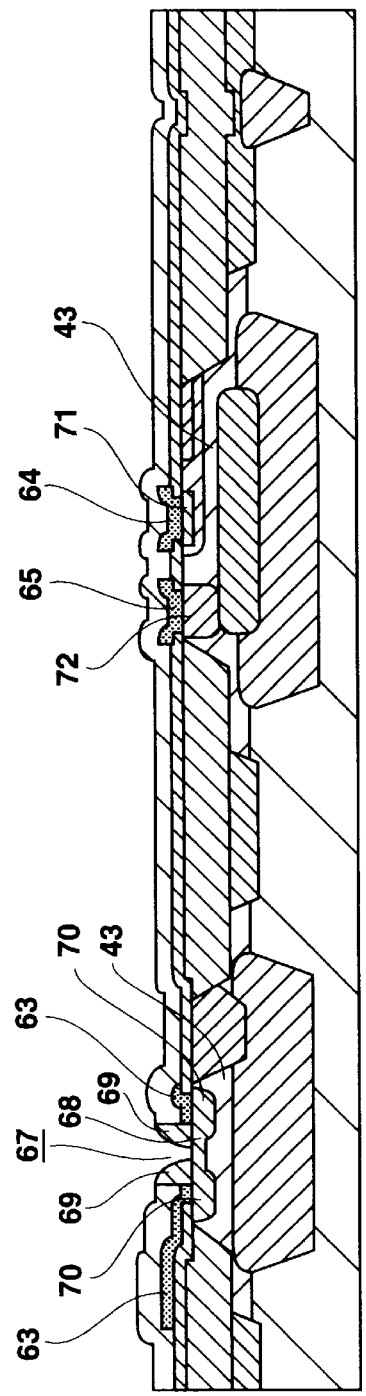
FIG. 11A
FIG. 11B

METHOD FOR FORMING EMBEDDED DIFFUSION LAYERS USING AN ALIGNMENT MARK

BACKGROUND OF THE INVENTION

This invention relates to a semiconductor device manufacturing method, and particularly to the formation of an alignment mark and an embedded diffusion layer.

Complementary bipolar transistors wherein an NPN transistor and a PNP transistor are combined have been used in the related art for example as constituent devices of push-pull circuits in high-output amplifier stages of audio equipment. In recent years, in LSI for high frequency uses typified by amplifying/wave-detecting circuits for intermediate picture frequencies of UHF television tuners and signal processing circuits for high-speed communication and for optical communication, the realization of so-called 'system on chip' has been progressing and with respect to complementary bipolar transistor circuits also methods for manufacturing faster and more highly integrated circuits with fewer manufacturing steps have been being sought.

A typical complementary bipolar transistor of the related art will now be described with reference to the sectional construction view of FIG. 1.

As shown in FIG. 1, in this complementary bipolar transistor 101 a vertical type NPN transistor (hereinafter abbreviated to V-NPNTr) 102 and a vertical type PNP transistor (hereinafter abbreviated to V-PNPTr) 103 whose emitter/base/collector junctions are formed in the depth direction of the substrate, i.e. the vertical direction, are formed on the same for example p-type substrate 111.

In the V-NPNTr 102, an $n^+$-type embedded collector region 113 is formed in a region of the boundary vicinity between the p-type substrate 111 and an n-type epitaxial layer 112 formed thereon. The n-type epitaxial layer 112 has its upper layer part divided into a plurality of so-called island-shaped device formation regions by device separation regions 114 formed by selective oxidation separation (so-called LOCOS (Local Oxidation of Silicon)). In surface layer parts of these device formation regions are formed a p-type base region 115 and an $n^+$-type collector takeout region 116 connected to the $n^+$-type embedded collector region 113.

Three types of takeout electrode consisting of a polycrystalline silicon layer are connected to the upper surfaces of the device formation regions by way of an inter-layer insulating film 117 made of silicon oxide ($SiO_2$). That is, an emitter takeout electrode 118 and a base takeout electrode 119 are connected to a part facing the base region 115, and an $n^+$-type emitter region 120 and a $p^+$-type base takeout region 127 are formed in the base region 115 by impurity diffusion from these electrodes respectively. A collector takeout electrode 121 is connected to a part facing the $n^+$-type collector takeout region 116, and an $n^+$-type collector takeout region 122 is formed by impurity diffusion from this collector takeout electrode 121.

An emitter electrode 123, a base electrode 124 and a collector electrode 125 consisting of a multi-layer film having an aluminum metal as its main material are respectively connected to the emitter takeout electrode 118, the base takeout electrode 119 and the collector takeout electrode 121 through openings formed in an inter-layer insulating film 126.

In the V-PNPTr 103, in a region of the boundary vicinity of the p-type substrate 111 and the n-type epitaxial layer 112 formed thereon, an $n^+$-type embedded separation region 131 for electrically separating this V-PNPTr 103 from the p-type substrate 111 and a $p^+$-type embedded collector region 132 are formed in a stacked state. Also, a p-type well 133 formed by carrying out ion injection into the n-type epitaxial layer 112 is provided on the upper side of the $p^+$-type embedded collector region 132. This p-type well 133 has its upper layer part divided into a plurality of so-called island-shaped device formation regions by device separation regions 114 formed by LOCOS. In surface layer parts of these device formation regions are formed an n-type base region 134 and a $p^+$-type collector takeout region 135 connected to the $p^+$-type embedded collector region 132.

Three types of takeout electrode consisting of a polycrystalline silicon layer are connected to the upper surfaces of the device formation regions by way of an inter-layer insulating film 117 made of silicon oxide ($SiO_2$). That is, an emitter takeout electrode 136 and a base takeout electrode 137 are connected to a part facing the base region 134, and a $p^+$-type emitter region 138 and an $n^+$-type base takeout region 139 are formed in the base region 134 by impurity diffusion from these electrodes respectively. A collector takeout electrode 140 is connected to a part facing the collector takeout region 135, and a $p^+$-type collector takeout region 141 is formed by impurity diffusion from this collector takeout electrode 140.

An emitter electrode 141, a base electrode 142 and a collector electrode 143 consisting of a multi-layer film having an aluminum metal as its main material are respectively connected to the emitter takeout electrode 136, the base takeout electrode 137 and the collector takeout electrode 140 through openings formed in an inter-layer insulating film 117.

Between the V-NPNTr 102 and the V-PNPTr 103, and between these and other devices not shown in the drawing, a $p^+$-type device separation diffusion layer (channel stop diffusion layer) 151 is formed on the lower side of the device separation region 114. This device separation diffusion layer 151 is a so-called face-to-face separator wherein a lower layer side diffusion layer 152 and an upper layer side diffusion layer 153 are stacked into two upper/lower levels.

However, in the manufacturing process of the complementary bipolar transistor described above, as shown in FIG. 2, it is necessary to sequentially selectively ion inject an impurity 211 for forming the $n^+$-type embedded collector region (113) and an impurity 212 for forming the $n^+$-type embedded separation region (131) into the p-type substrate 111. To do this, it is necessary to first form an alignment mark 161 for position alignment in the surface of the p-type substrate 111. Therefore, it has been necessary to separately carry out a step just for forming the alignment mark 161.

Also, because of the need to form the $n^+$-type embedded separation region for electrically separating the $p^+$-type embedded collector region of the V-PNPTr from the p-type substrate, compared to a manufacturing process of an ordinary bipolar transistor the process is long and complicated.

Furthermore it is necessary for the $n^+$-type embedded separation region to be formed as thick and in as deep a position in the p-type substrate as possible, and generally it is formed in the p-type substrate first by gas-phase diffusing an n-type impurity. However, this $n^+$-type embedded separation region, during the manufacturing process of the complementary bipolar transistor, in the course of the step of forming the device separation regions using selective oxidation, which is a high-temperature, long-duration heat-treatment process, causes upward diffusion toward the inside of the n-type epitaxial layer. Consequently, the n-type epitaxial layer must be formed to an ample thickness (usually a thickness of about 3 µm).

The impurity profile of a related art V-PNPTr will be described with reference to FIG. 3. In the figure, the vertical axis shows impurity concentration (log scale) and the horizontal axis shows depth from the substrate surface.

From this impurity profile it can be seen that the existence of the $p^+$-type embedded collector region of the V-PNPTr also is a factor causing the n-type epitaxial layer to be a thick film.

The $p^+$-type embedded collector region is generally formed before the n-type epitaxial layer, but on this n-type epitaxial layer a device separation region is formed by a LOCOS step, which is the second most severe high-temperature and long-duration heat-treatment step in the manufacturing process of the complementary bipolar transistor. Consequently, during this LOCOS process, the $p^+$-type embedded collector region causes upward diffusion. Therefore, it is necessary to make the n-type epitaxial layer thick to allow for this upward diffusion.

Thus, from the viewpoint of improving the characteristics of the V-PNPTr it is necessary to make the n-type epitaxial layer thick, but this means enlarging the collector layer of the V-NPNTr. Consequently, a so-called base widening effect (or Kirk effect) tends to occur, and the cutoff frequency of the V-NPNTr falls and its operating speed falls.

Furthermore, in the manufacturing process of the complementary bipolar transistor described above, two ion injection steps are expended in the formation of the device separation diffusion layer. This is because since it is necessary to make the n-type epitaxial layer thick for the reasons discussed above, separation of the V-NPNTr and the V-PNPTr with a single diffusion layer forming the device separation regions and the device separation diffusion layer is not possible.

Here, the diffusion layer on the lower layer side of the device separation diffusion layer is formed by an ion injection step common with the $p^+$-type embedded collector region of the V-PNPTr and the diffusion layer on the upper layer side of the device separation diffusion layer is formed by an ion injection step common with the $p^+$-type collector takeout region of the V-PNPTr. However, formation of the $p^+$-type collector takeout region of the V-PNPTr is not necessary in a manufacturing process of an ordinary bipolar transistor wherein the n-type epitaxial layer may be thin. This is because connection between the $p^+$-type embedded collector region and the collector takeout electrode is sufficient with just the $p^+$-type collector takeout region formed by impurity diffusion from the collector takeout electrode.

In the semiconductor industry, cost reduction is of paramount importance, and it is necessary to reduce numbers of manufacturing steps as much as possible.

SUMMARY OF THE INVENTION

Accordingly, an object of this invention is to solve the problems described above and provide a semiconductor device manufacturing method which avoids the $n^+$-type collector takeout region being made a thick film and makes it possible to reduce the number of manufacturing steps.

To achieve the above object and other objects, in a first manufacturing method provided by the invention, in a first step, after forming an insulating film on a semiconductor base a first opening is formed in the insulating film above a region where an alignment mark is to be formed and at the same time a second opening is formed in the insulating film above a region where a first embedded diffusion layer is to be formed. Then, in a second step, after forming a doping mask on the semiconductor base in a state covering the insulating film, with the first opening as an alignment mark a third opening is then formed in the doping mask by a lithography technique using this alignment mark as a reference of alignment above a region where a second embedded diffusion layer is to be formed. Then, in a third step, an impurity for forming the second embedded diffusion layer is doped into the semiconductor base through the third opening and through the insulating film. Thereafter, in a fourth step, after removing the doping mask, the first embedded diffusion layer is formed by doping an impurity into the semiconductor base through the second opening. Doping of the impurity for forming the first embedded diffusion layer is preferably carried out by solid-phase diffusion.

In this first manufacturing method, because the first opening constituting an alignment mark and the second opening constituting the opening through which the impurity for forming the first embedded diffusion layer is introduced are formed simultaneously, a step for forming the alignment mark separately is not necessary. As a result, the number of steps is reduced.

Also, with the method wherein the doping of the impurity for forming the first embedded diffusion layer is carried out by solid-phase diffusion, the impurity constituting the second embedded diffusion layer is diffused by heat-treatment during the solid-phase diffusion. Consequently, a heat-treatment step for diffusing the impurity constituting the second embedded diffusion layer is eliminated.

In a second manufacturing method provided by the invention, in a first step, after forming an insulating film on a semiconductor base, a first opening is formed in the insulating film above a region where an alignment mark is to be formed and at the same time a second opening is formed in the insulating film above a region where a first embedded diffusion layer is to be formed and further a concave part is formed by removing an upper layer portion of the semiconductor base under the first opening. Then, in a second step, after forming a doping mask on the semiconductor base in a state covering the insulating film, with the first opening as an alignment mark a third opening is then formed in the doping mask by a lithography technique using this alignment mark as a reference of alignment above a region where a second embedded diffusion layer is to be formed. Then, in a third step, an impurity for forming the second embedded diffusion layer is doped into the semiconductor base through the third opening and through the insulating film. Thereafter in a fourth step, after removing the doping mask, the first embedded diffusion layer is formed by doping an impurity into the semiconductor base through the second opening.

Doping of the impurity for forming the first embedded diffusion layer is carried out by ion injection or solid-phase diffusion.

In this second manufacturing method, because the first opening constituting the alignment mark and the second opening constituting the opening through which the impurity for forming the first embedded diffusion layer is introduced are formed simultaneously, the step for forming the alignment mark doubles as another step. Consequently, the number of steps is reduced. Also, because the semiconductor base below the first opening is dug into in making the alignment mark, the alignment mark remains even after the insulating film is removed.

Also, in the method wherein the doping of the impurity for forming the first embedded diffusion layer is carried out by ion injection, because it is possible to use the insulating film as a mask, a step of forming a mask is eliminated.

Also, in the method wherein the doping of the impurity for forming the first embedded diffusion layer is carried out by solid-phase diffusion, the impurity to constitute the second embedded diffusion layer is diffused by heat-treatment during the solid-phase diffusion. Consequently, a heat-treating step for diffusing the impurity to become the second embedded diffusion layer is eliminated.

In a third manufacturing method provided by the invention, in a first step, on the surface of a semiconductor base in whose surface a step pattern serving as an alignment mark is provided and in an upper layer part of which are formed a first embedded diffusion layer and a second embedded diffusion layer an epitaxial layer of opposite conductive type to the semiconductor base is formed. Then, in a second step, an oxide film is formed in the epitaxial layer by selective thermal oxidation. Thereafter, in a third step, an impurity diffusion layer is formed in the epitaxial layer by ion injection having a projection range in the epitaxial layer above the second embedded diffusion layer.

A device separation diffusion layer may be formed in the epitaxial layer by the ion injection for forming the impurity diffusion layer.

In this third manufacturing method, because after an epitaxial layer is formed in the surface of a semiconductor base in which are formed a first embedded diffusion layer and a second embedded diffusion layer and then an oxide film is formed in the epitaxial layer by selective thermal oxidation an impurity diffusion layer is formed in the epitaxial layer by ion injection having a projection range in this epitaxial layer, high-temperature heat-treatment such that impurities greatly diffuse is carried out before this impurity diffusion layer is formed and consequently it is not necessary to make the epitaxial layer thick in consideration of diffusion of impurities.

Also, because the device separation diffusion layer is formed in the epitaxial layer by the ion injection for forming the impurity diffusion layer, the number of steps is reduced.

BRIEF DESCRIPTION OF THE DRAWINGS

FIGS. 9A and 9B are (second) manufacturing process views of a preferred embodiment pertaining to the first and third modes of practicing the invention;

FIGS. 10A and 10B are (third) manufacturing process views of a preferred embodiment pertaining to the first and third modes of practicing the invention;

FIGS. 11A and 11B are (fourth) manufacturing process views of a preferred embodiment pertaining to the first and third modes of practicing the invention;

DETAILED DESCRIPTION OF THE PREFERRED EMBODIMENTS

An example of a first mode of practicing the invention will be described with reference to the manufacturing process views of FIGS. 4A through 4D.

Figure 1:
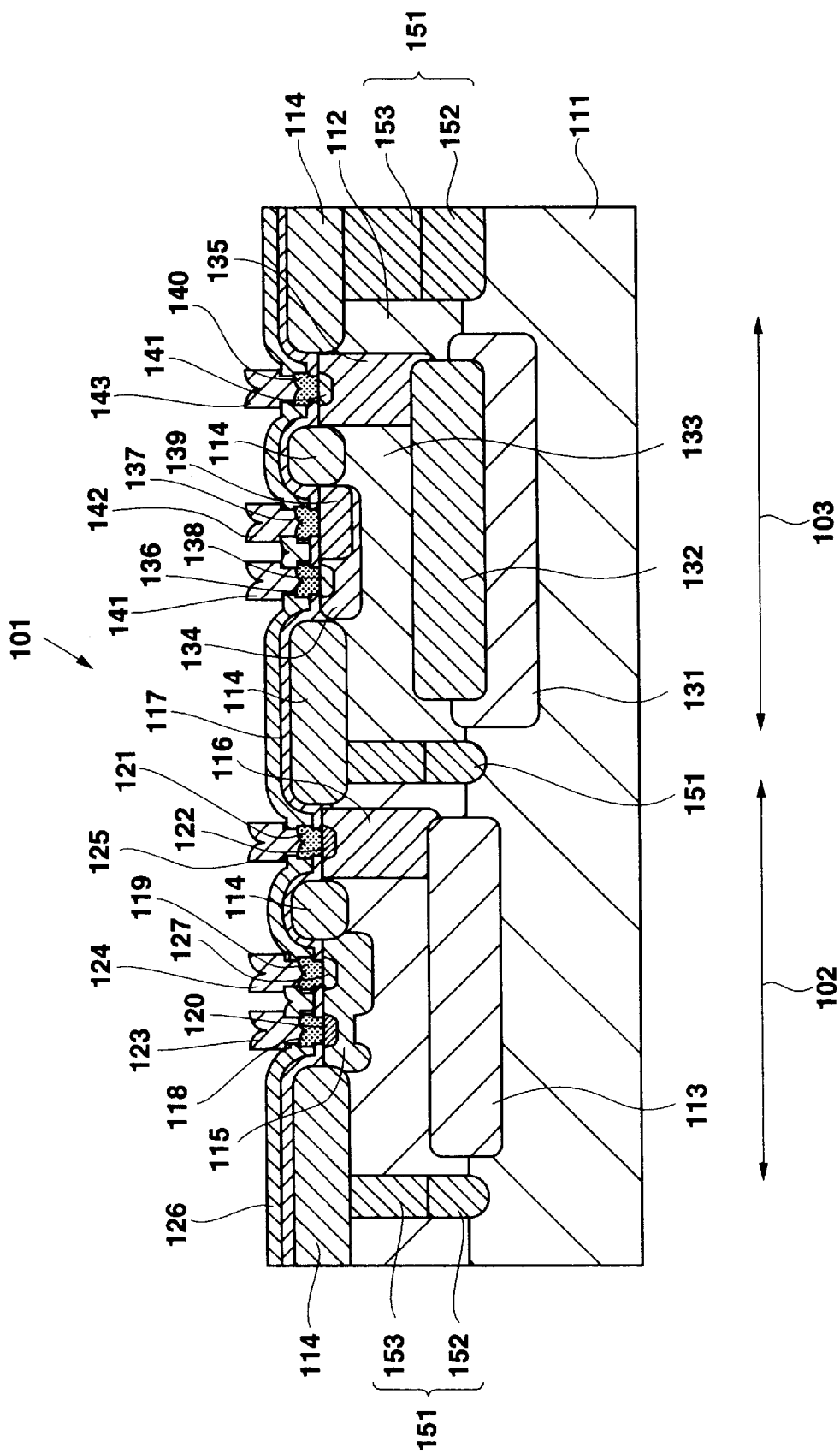
FIG. 1 is a sectional construction view of a related art complementary bipolar transistor.
Figure 2:
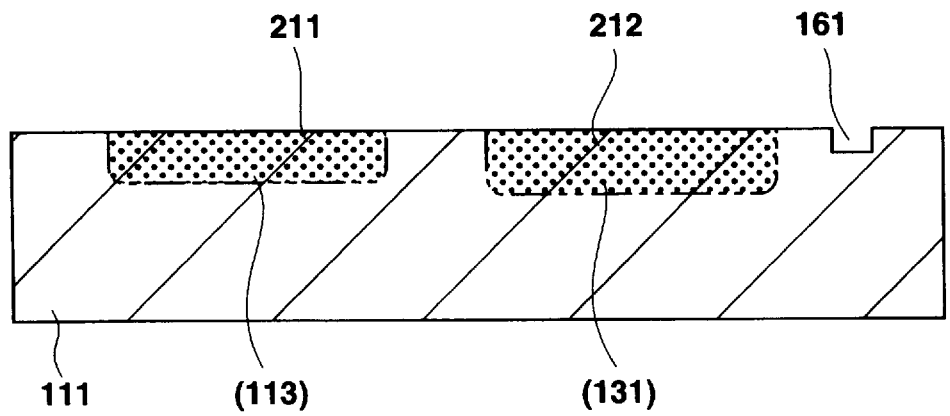
FIG. 2 is a view illustrating a problem of the related art.
Figure 3:
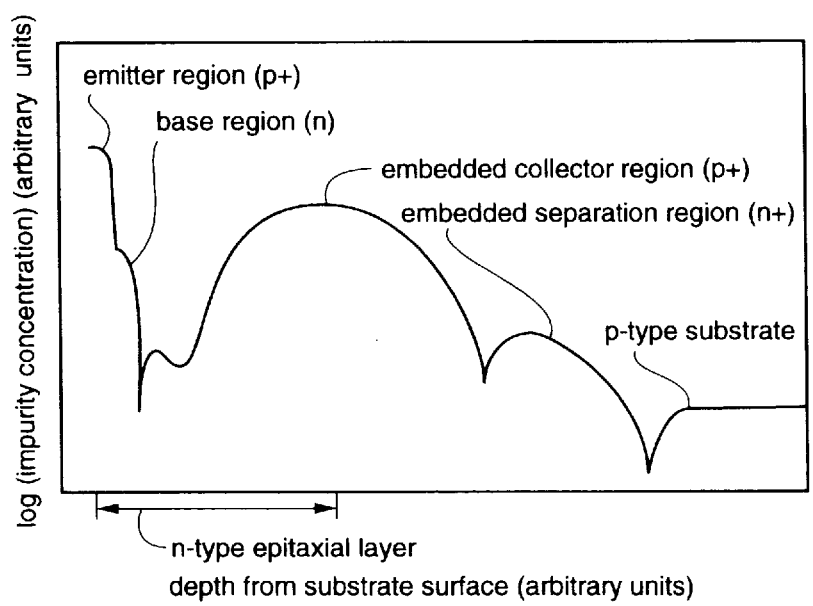
FIG. 3 is an impurity profile view of a related art V-PNPTr.
Figure 4A:
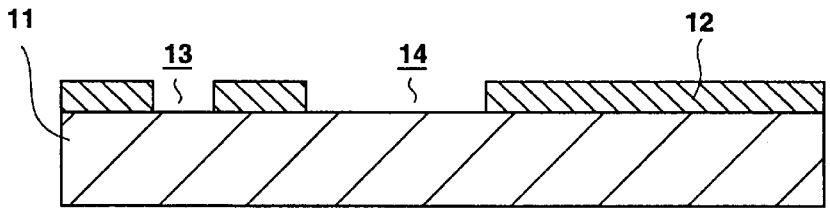
FIGS. 4A through 4D are manufacturing process views pertaining to an example of a first mode of practicing the invention.

In a first step shown in FIG. 4A, an insulating film 12 is formed on a semiconductor substrate 11. This insulating film 12 consists of for example a silicon oxide film. After that, for example by a lithography technique and an etching technique, a first opening 13 is formed in the insulating film 12 above a region where an alignment mark is to be formed and at the same time a second opening 14 is formed in the insulating film 12 above a region where a first embedded diffusion layer is to be formed.

Figure 4B:
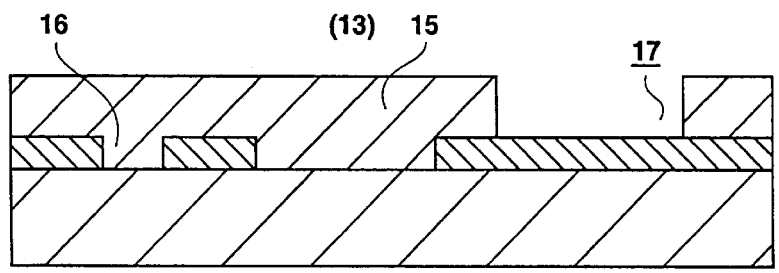

Then, a second step shown in FIG. 4B is carried out. In this step, a doping mask 15 is formed on the semiconductor substrate 11 in a state covering the insulating film 12. This doping mask 15 is made of for example resist. Then, with the first opening 13 as an alignment mark 16, by a lithography technique using this alignment mark 16 as an alignment reference, a third opening 17 is formed in the doping mask 15 above a region where a second embedded diffusion layer is to be formed.

Figure 4C:
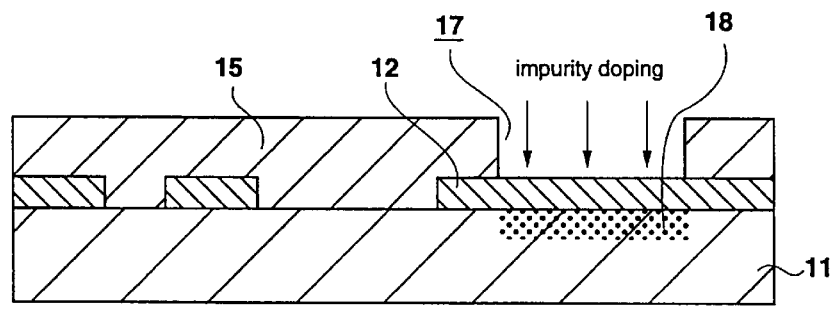

A third step shown in FIG. 4C is then carried out. In this step, an impurity 18 for forming the second embedded diffusion layer is doped into the semiconductor substrate 11 through the third opening 17 and the insulating film 12.

This doping is carried out for example by ion injection, and the projection range of the ions in this ion injection is set to the surface of the semiconductor substrate 11 or to a depth within 0.4 $\mu$m of that surface.

After that, a fourth step is carried out. In this step, by for example ashing and cleaning treatment, the doping mask 15 is removed.

Figure 4D:
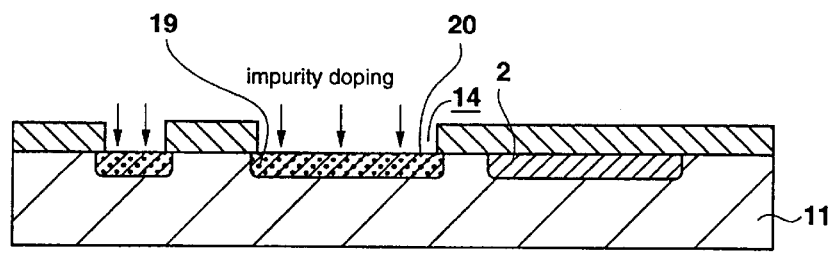

After that, as shown in FIG. 4D, a first embedded diffusion layer 20 is formed by doping an impurity 19 into the semiconductor substrate 11 through the second opening 14 by for example solid-phase diffusion. At the same time, the impurity (18) is also diffused and a second embedded diffusion layer 21 is formed.

In this first mode of practicing the invention, because the first opening 13 constituting the alignment mark 16 and the second opening 14 constituting the opening through which the impurity for forming the first embedded diffusion layer 20 is introduced are formed in the insulating film 12 simultaneously, a step for forming an alignment mark separately is not necessary. Consequently, the number of steps is reduced.

Also, with the method wherein the doping for forming the first embedded diffusion layer 20 is carried out by solid-phase diffusion, the impurity 18 is also diffused by the heat-treatment of during the solid-phase diffusion and the second embedded diffusion layer 21 is formed. Consequently, a heat-treating step for diffusing this impurity 18 is eliminated.

Figure 5A:
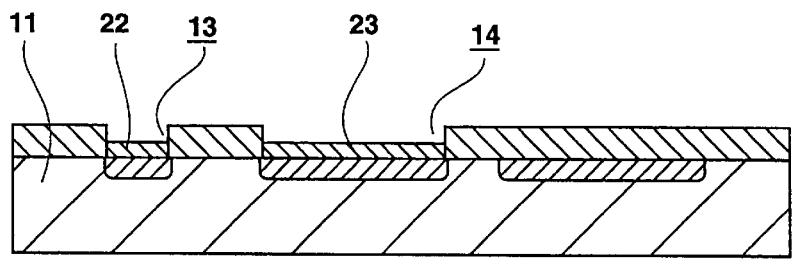
FIGS. 5A and 5B are manufacturing process views of an example wherein solid-phase diffusion is used.

Also, in this solid-phase diffusion, as shown in FIG. 5A, oxide films 22, 23 are formed on the semiconductor substrate 11 exposed at the bottom surfaces of the first opening 13 and the second opening 14.

Figure 5B:
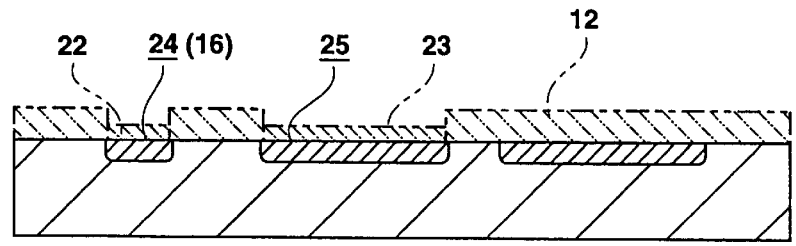

As a result of this, as shown in FIG. 5B, when the insulating film 12 (shown with a broken line) is removed, the oxide films 22, 23 (shown with broken lines) are also removed, concave parts 24, 25 are consequently formed in the surface of the semiconductor substrate 11. The concave part 24 becomes the alignment mark 16.

Next, an example of a second mode of practicing the invention will be described with reference to the manufacturing process views of FIG. 6A through FIG. 6D. In the drawings, constituent parts the same as those described with reference to FIGS. 4A through 4D above have been given the same reference numbers.

Figure 6A:
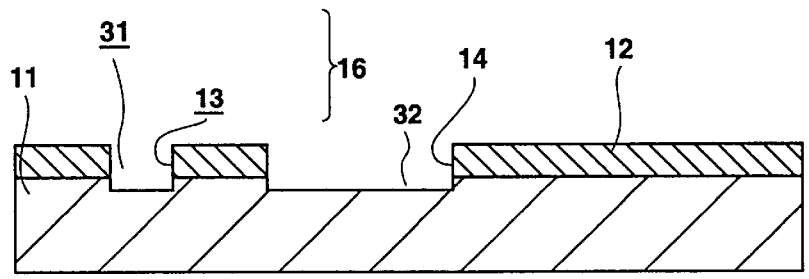
FIGS. 6A through 6D are manufacturing process views pertaining to an example of a second mode of practicing the invention.

In a first step shown in FIG. 6A, an insulating film 12 is formed on a semiconductor substrate 11. This insulating film 12 consists for example of a silicon oxide film. After that, for example, by a lithography technique and an etching technique, a first opening 13 is formed in the insulating film 12 above a region where an alignment mark is to be formed and at the same time a second opening 14 is formed in the insulating film 12 above a region where a first embedded diffusion layer is to be formed.

Etching is further advanced and a surface layer of the semiconductor substrate 11 in the bottom parts of the first opening 13 and the second opening 14 is removed and a first concave part 31 and a second concave part 32 constituting step patterns are thereby formed.

Figure 6B:
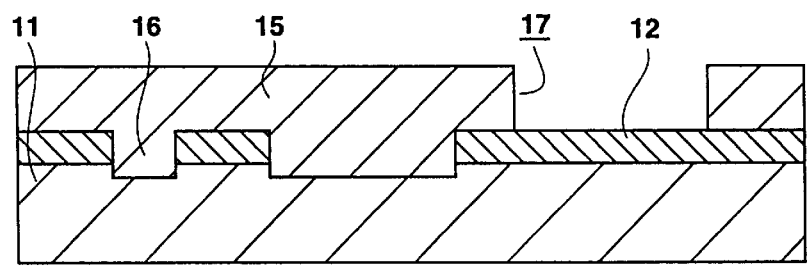

A second step shown in FIG. 6B is then carried out. In this step, a doping mask 15 is formed on the semiconductor substrate 11 in a state covering the insulating film 12. This doping mask 15 is made of for example resist. Then, with the first opening 13 as an alignment mark 16, by a lithography technique using this alignment mark 16 as an alignment reference, a third opening 17 is formed in the doping mask 15 above a region where a second embedded diffusion layer is to be formed.

Figure 6C:
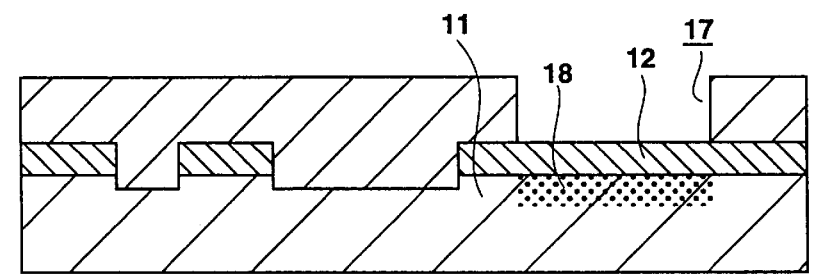

A third step shown in FIG. 6C is then carried out. In this step, an impurity 18 for forming the second embedded diffusion layer is doped into the semiconductor substrate 11 through the third opening 17 and the insulating film 12.

This doping is carried out for example by ion injection, and the projection range of the ions (the impurity 18) in this ion injection is set to the surface of the semiconductor substrate 11 or to a depth within 0.4 μm of that surface.

After that, a fourth step is carried out. In this step, by for example ashing and cleaning treatment, the doping mask 15 is removed.

Figure 6D:
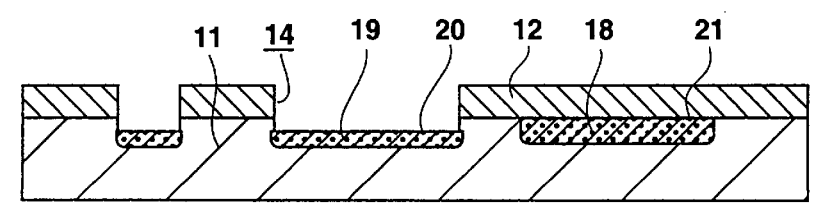

After that, as shown in FIG. 6D, an impurity 19 is doped into the semiconductor substrate 11 through the second opening 14. Annealing is then carried out, the impurities 18, 19 are diffused and a first embedded diffusion layer 20 and a second embedded diffusion layer 21 are thereby formed.

This doping is carried out by for example ion injection. The projection range of the ions (the impurity 19) in this ion injection is set to a depth such that the insulating film 12 serves as an ion injection mask.

Alternatively, the doping is carried out by solid-phase diffusion. The case of solid-phase diffusion is the same as that described above with reference to FIGS. 4A through 4D.

In this second mode of practicing the invention, because the first opening 13 constituting the alignment mark 16 and the second opening 14 constituting the opening through which the impurity for forming the first embedded diffusion layer 20 is introduced are formed in the insulating film 12 simultaneously, a step for forming an alignment mark separately is not necessary. Consequently, the number of steps is reduced.

Also, because the semiconductor substrate 11 is dug into further than the first opening 13 constituting the alignment mark 16 in making the alignment mark 16, it is possible to leave an alignment mark 16 even after the insulating film 12 is removed. Consequently, it is possible to carry out formation of the first embedded diffusion layer 20 by ion injection.

With the method wherein the doping of the impurity for forming the first embedded diffusion layer 20 is carried out by ion injection, because the insulating film 12 becomes an ion injection mask, a masking step for the ion injection is eliminated.

Also, when the doping of the impurity for forming the first embedded diffusion layer 20 is carried out by solid-phase diffusion, the impurity 18 constituting the second embedded diffusion layer 21 is also diffused by heat-treatment during the solid-phase diffusion. Consequently, a heat-treating step for diffusing this impurity 18 is eliminated.

Next, an example of a third mode of practicing the invention will be described with reference to the manufacturing process views of FIG. 7A through FIG. 7C. Constituent parts the same as those described above with reference to FIGS. 4A through 4D have been given the same reference numbers.

Figure 7A:
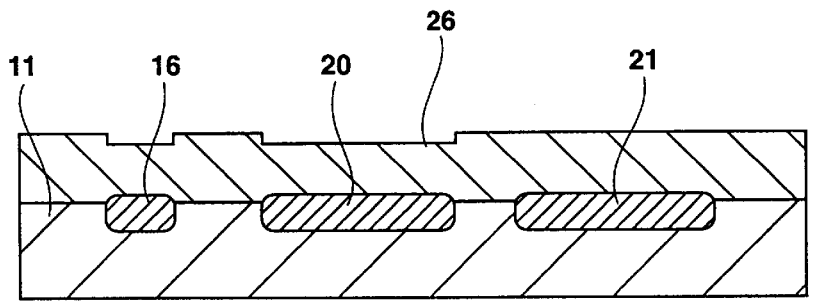
FIGS. 7A through 7C are manufacturing process views pertaining to an example of a third mode of practicing the invention.

As shown in FIG. 7A, in a first step, an alignment mark 16 consisting of a step pattern (concave part) is provided in the surface of a semiconductor substrate 11 and a first embedded diffusion layer 20 and a second embedded diffusion layer 21 are formed in an upper layer part of this semiconductor substrate 11. An epitaxial layer 26 for example of opposite conductive type to this semiconductor substrate 11 is formed in the surface of this semiconductor substrate 11 by epitaxial growth.

Figure 7B:
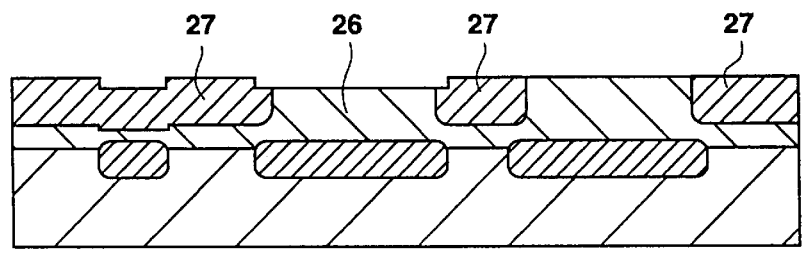

Then, in a second step shown in FIG. 7B, by selective thermal oxidation (for example LOCOS) for example a plurality of island-shaped oxide films 27 to constitute device separators are formed in predetermined positions on the epitaxial layer 26.

Figure 7C:
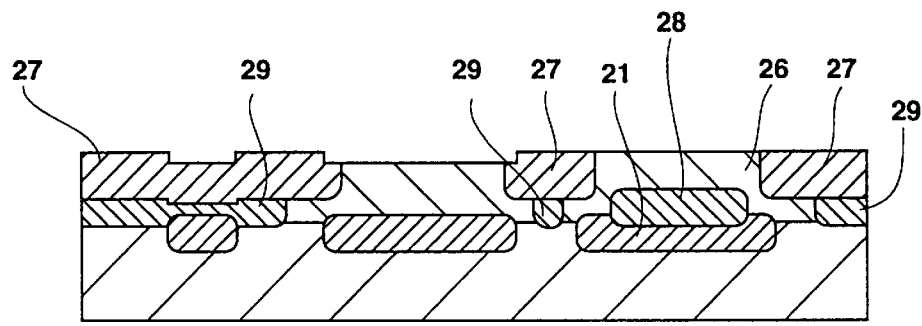

In a third step shown in FIG. 7C, an impurity is injected into the epitaxial layer 26 by ion injection having a projection range in the epitaxial layer 26 above the second embedded diffusion layer 21 and an impurity diffusion layer 28 is formed by subsequent heat-treatment.

In this ion injection, at the same time as forming the impurity diffusion layer 28, a device separation diffusion layer (channel stop diffusion layer) 29 may be formed in the epitaxial layer 26 below the oxide films 27.

In this third mode of practicing the invention, because after the epitaxial layer 26 is formed in the surface of the semiconductor substrate 11 on which are formed the first embedded diffusion layer 20 and the second embedded diffusion layer 21 and the oxide films 27 are then formed in this epitaxial layer 26 by selective thermal oxidation the impurity diffusion layer 28 is formed by ion injection having a projection range in this epitaxial layer 26, high-temperature heat-treatment such that impurities greatly diffuse is completed before this impurity diffusion layer 28 is formed and consequently it is not necessary to make the epitaxial layer 26 thick in consideration of diffusion (and particularly upward diffusion) of impurities. Therefore, the epitaxial layer can be formed about ½ to ⅓ thinner than in the past.

Also, because the device separation diffusion layer 29 is formed in the epitaxial layer 26 by the ion injection for forming the impurity diffusion layer 28, two diffusion layers are formed with one ion injection. Consequently, the number of steps is reduced.

Next, a preferred embodiment of the first and third modes of practicing the invention described above applied to a complementary bipolar transistor comprising a vertical NPN transistor (hereinafter abbreviated to V-NPNTr) and a vertical PNP transistor (hereinafter abbreviated to V-PNPTr) will be described with reference to the manufacturing process views of FIG. 8A through FIG. 12. In the drawings, constituent parts the same as those described with reference to FIGS. 4A through 4D above have been given the same reference numbers.

Figure 8A:
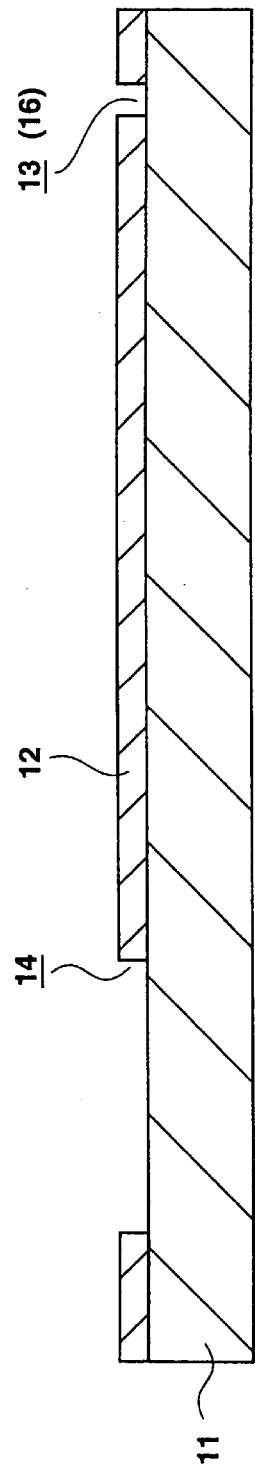
FIGS. 8A and 8B are (first) manufacturing process views of a preferred embodiment pertaining to the first and third modes of practicing the invention.

As shown in FIG. 8A, using a p-type silicon substrate as a semiconductor substrate 11, for example by thermal oxidation an insulating film 12 made of silicon oxide ($SiO_2$) was formed to a thickness of for example 330 nm on the semiconductor substrate 11.

Then, by a lithography technique, (for example resist coating, exposure, developing and baking; hereinafter, lithography technique will refer to basically carrying out these processes) and an etching technique, a first opening 13 and a second opening 14 were formed in a part to serve as an alignment mask used in the exposure and above a region to constitute a collector region of the V-NPNTr. This first opening 13 constitutes an alignment mark 16.

The alignment mark 16 is determined by the exposure apparatus, and only one opening pattern is shown in FIG. 8A, but normally it consists of for example a plurality of square opening patterns formed with a uniform spacing. This alignment mark 16 is not limited to the pattern shaped described above, and needless to say is formed in a pattern of a shape matched to the type of the exposure apparatus.

Figure 8B:
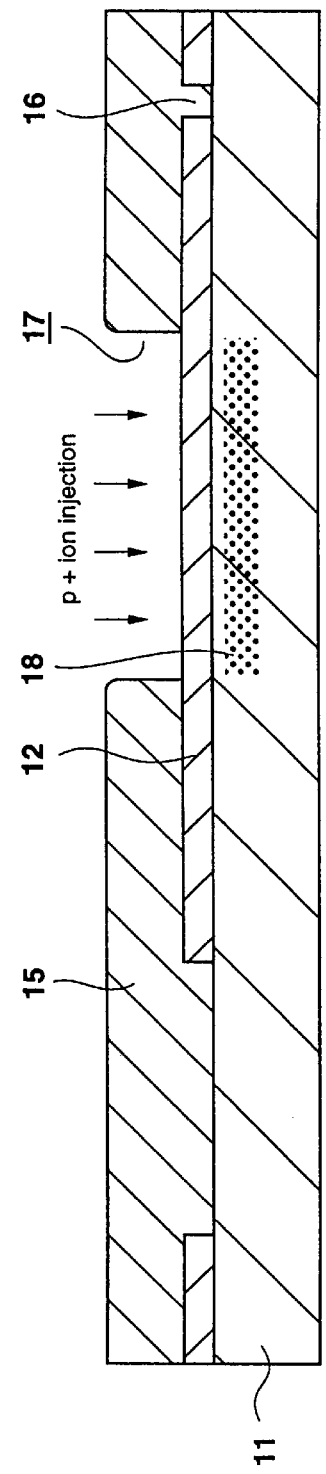

Next, as shown in FIG. 8B, for example by spin coating, a doping mask 15 was formed with for example resist on the semiconductor substrate 11 in a state covering the insulating film 12. After exposure was then carried out using the alignment mark 16 as a reference of alignment, processes such as developing and baking were carried out and a third opening 17 was formed in the doping mask 15 above a region where an embedded separation region of the V-PNPTr was to be formed.

An impurity 18 was then injected into the semiconductor substrate 11 through the third opening 17 and through the insulating film 12 by ion injection using the doping mask 15. The conditions of the ion injection at this time were that for example phosphorous ($P^+$) was used as the impurity 18, the injection energy was set to a predetermined value in the range 300 keV to 700 keV and the dose amount was set to a predetermined value in the range $1 \times 10^{13}/cm^2$ to $7 \times 10^{13}/cm^2$. As a result, the projection range of the ions was the surface of the semiconductor substrate 11 or a depth within 0.4 μm from that surface.

After that, the doping mask 15 was removed by ashing and cleaning treatment.

Then, as shown in FIG. 9A, by solid-phase diffusion using antimony oxide ($Sb_2O_3$), antimony was caused to diffuse into the semiconductor substrate 11 through the second opening 14 and an n⁺-type embedded collector region 41 (corresponding to the first embedded diffusion layer 20 described above with reference to FIG. 4D) was thereby formed. At this time, antimony is diffused into the semiconductor substrate 11 through the first opening 13 also. As the conditions of this solid-phase diffusion, for example the atmosphere temperature was set to 1200° C. and the diffusion time was set to 1 hour.

During this solid-phase diffusion, the semiconductor substrate 11 exposed in the first and second openings 13, 14 was oxidized to about 50 nm, and oxide films 22, 23 of thickness 100 nm were thereby formed. Also, the phosphorous ion-injected into the embedded separation region of the V-PNPTr diffused and formed an n-type embedded separation region 42 (corresponding to the second embedded diffusion layer 21 described above with reference to FIG. 4D). In this solid-phase diffusion, because the impurity is diffused to a deep part of the semiconductor substrate 11, the impurity concentration in the surface vicinity of the semiconductor substrate 11 is kept low.

The semiconductor substrate 11 was then removed by hydrofluoric (HF) wet etching. At this time, the oxide films 22, 23 formed during the solid-phase diffusion were also removed at the same time.

As a result, as shown in FIG. 9B, concave parts 24, 25 (shown with broken lines) having a depth of about 50 nm were formed where the oxide films (22, 23) were removed.

Then, by an existing epitaxial growth technique, an n-type epitaxial layer 43 was formed on the semiconductor substrate 11. This n-type epitaxial layer 43 for example had a resistance in the range 1 Ωcm to 5 Ωcm and was formed to a desired thickness in the range 0.7 μm to 2.0 μm. In this epitaxial growth, because the concave part 24 is also transferred to the surface of the n-type epitaxial layer 43, a concave part 44 was formed in the surface of the n-type epitaxial layer 43. The concave part 24 was also similarly transferred to the surface of the n-type epitaxial layer 43.

Then, after a silicon oxide film 45 was formed on the surface of the n-type epitaxial layer 43 by thermal oxidation, by chemical gas-phase growth (hereinafter called CVD, or Chemical Vapor Deposition), a silicon nitride film 46 was formed to a thickness of for example 100 nm. In these film formations, on the concave part 44 a step of similar concave shape is formed and this step part becomes a new alignment mark 47.

Using this alignment mark 47, by a lithography technique, a resist pattern 48 covering the active regions was formed. Then, using the resist pattern 48, the silicon nitride film 46 and the silicon oxide film 45 were patterned.

After that, the resist pattern 48 was removed.

As shown in FIG. 10A, by the so-called recess LOCOS method, device separation regions 49 consisting of a thermal oxide film were formed on the n-type epitaxial layer 43 to a thickness of for example 800 nm.

Then, by ion injection, an n⁺-type sinker region 50 connected to the embedded collector diffusion layer 41 was formed in part of the region where the V-NPNTr is formed. As the conditions of this ion injection, for example, phosphorous ($P^+$) was used as the impurity, the injection energy was set to 70 keV and the dose amount to $5 \times 10^{15}/cm^2$. After that, thermal diffusion treatment for 30 minutes at 1000° C. was carried out.

Then, by an existing flattening technique, so-called bird's heads (not shown) of the device separation regions 49 were removed and flattening was carried out.

Next, by a lithography technique, a resist mask 53 provided with openings 51, 52 over the region where the V-PNPTr was to be formed and over parts of the device separation regions 49 was formed. An impurity was then injected into the n-type epitaxial layer 43 by ion injection using the resist mask 53 as an ion injection mask. As the conditions of the ion injection, for example boron (B+) was used as the impurity, the injection energy was set in the range 180 keV to 600 keV and the dose amount was set in the range $1\times10^{14}/cm^2$ to $1\times10^{15}/cm^2$.

As a result, as shown in FIG. 10B, a p$^+$-type collector region 54 was formed in a state reaching the n-type embedded separation region 42 in the n-type epitaxial layer 43 where the V-PNPTr was to be formed, and also a p$^+$-type device separation diffusion layer 55 was formed in a state reaching the semiconductor substrate 11 in the n-type epitaxial layer 43 below the device separation region 49.

Then, by ion injection, into a region constituting a base region 56 of the V-PNPTr, for example phosphorous (P$^+$) was selectively injected. As the conditions of this ion injection, for example phosphorous (P$^+$) was used as the impurity, the injection energy was set in the range 150 keV to 300 keV and the dose amount was set in the range $1\times10^{13}/cm^2$ to $1\times10^{14}/cm^2$.

By ion injection, an n-type impurity was further selectively injected into a region to constitute a base takeout region 57 of the V-PNPTr. As the conditions of this ion injection, for example arsenic (As$^+$) was used as the n-type impurity, the injection energy was set in the range 30 keV to 70 keV and the dose amount was set in the range $1\times10^{15}/cm^2$ to $1\times10^{16}/cm^2$.

After that, by CVD, a silicon oxide film 58 was formed to a thickness of for example 100 nm over the entire surface. Openings 59, 60 and 61 were then formed in the silicon oxide film 58 over a region where a base region of the V-NPNTr was to be formed, over a region where an emitter takeout electrode of the V-PNPTr was to be formed and over a region where a collector takeout electrode of the V-PNPTr was to be formed.

Also, by CVD, a polysilicon film 62 was formed over the entire surface of the silicon oxide film 58 side to a thickness of for example 150 nm.

After that, by ion injection, a p-type impurity was injected into the polysilicon film 62. As the conditions of this ion injection, for example boron difluoride (BF$_2^+$) was used as the p-type impurity, the injection energy was set in the range 30 keV to 70 keV and the dose amount was set in the range $1\times10^{15}/cm^2$ to $1\times10^{16}/cm^2$.

Then, by a lithography technique and etching, the polysilicon film 62 was patterned and as shown in FIG. 11A, a base takeout electrode 63 of the V-NPNTr and an emitter takeout electrode 64 and a collector takeout electrode 65 of the V-PNPTr were formed. In this etching, for example trichlorotrifluoroethane (C$_2$, Cl$_3$, F$_3$) was used as the etching gas.

After that, by CVD, a silicon oxide film 66 was formed to a thickness of for example 300 nm over the entire surface of the polysilicon film (62) side.

Then, by a lithography technique and etching, an emitter opening 67 was formed in the base takeout electrode 63 and the silicon oxide film 66 above a region to constitute an emitter region of the V-NPNTr, and the surface of the n-type epitaxial layer 43 was thereby exposed.

Then, as shown in FIG. 11B, by injecting a p-type impurity through the emitter opening 67 into the n-type epitaxial layer 43 by ion injection, an intrinsic base region 68 of the V-PNPTr was formed. As the conditions of this ion injection, boron difluoride (BF$_2^+$) was used as the p-type impurity, the injection energy was set in the range 30 keV to 70 keV and the dose amount was set in the range $1\times10^{13}/cm^2$ to $1\times10^{14}/cm^2$.

After that, after forming a silicon oxide film over the entire surface to a thickness of for example 600 nm by CVD, annealing for example for 10 minutes at 900° C. was carried out. The entire surface of the silicon oxide film was then etched back and a side wall insulating film 69 was formed on the side walls of the emitter opening 67. This side wall insulating film 69 separates the emitter takeout electrode and the base takeout electrode. Also, as a result of this annealing, boron in the base takeout electrode 63 diffused into the n-type epitaxial layer 43 and formed a p$^+$-type graft base region 70 of the V-NPNTr and boron in the emitter takeout electrode 64 and the collector takeout electrode 65 diffused into the n-type epitaxial layer 43 and formed a p$^+$-type emitter region 71 and a p$^+$-type collector takeout region 72 of the V-PNPTr.

Figure 12:
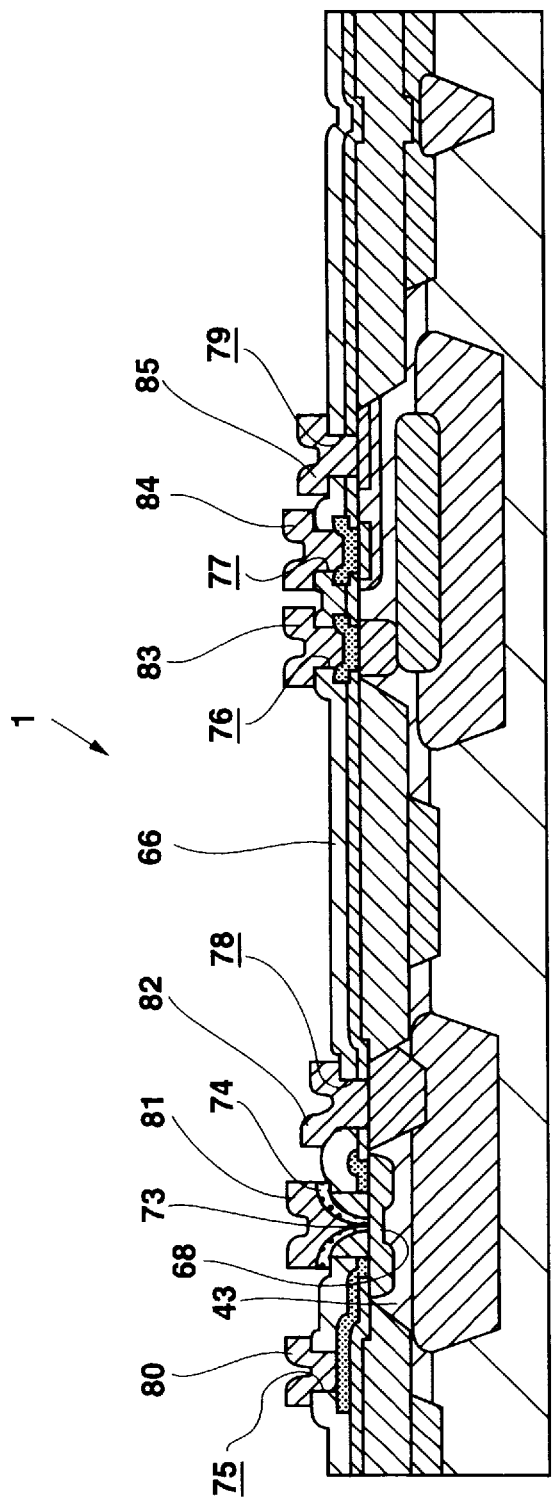
FIG. 12 is a (fifth) manufacturing process view of a preferred embodiment pertaining to the first and third modes of practicing the invention.

Then, as shown in FIG. 12, by CVD a polysilicon film was formed to a thickness of for example 150 nm over the entire surface. After that, by ion injection, an n-type impurity was injected into the entire surface of the polysilicon film. As the conditions of this ion injection, for example, arsenic (As$^+$) was used as the n-type impurity, the injection energy was set in the range 30 keV to 70 keV and the dose amount was set in the range $1\times10^{15}/cm^2$ to $1\times10^{16}/cm^2$.

Annealing (for example RTA (Rapid Thermal Annealing)) was then carried out, the impurity in the polysilicon film was diffused into the upper layer of the intrinsic base region 68 formed in the n-type epitaxial layer 43 and an emitter region 73 of the V-NPNTr was thereby formed. The annealing was carried out for example in the range 1000° C. to 1100° C. and in the range 5 seconds to 30 seconds.

The polysilicon film was then patterned by a lithography technique and an etching technique, and an emitter takeout electrode 74 was thereby formed. In this etching, for example trichlorotrifluoroethane (C$_2$, Cl$_3$, F$_3$) and sulfur hexafluoride (SF$_6$) were used.

Then, after contact holes 75 to 77 were formed in the silicon oxide film 66 and contact holes 78, 79 were formed in the silicon oxide film 66 and the silicon oxide film 58, formation of metal electrodes 80 to 85 was carried out and a complementary bipolar transistor 1 was thereby completed.

In the preferred embodiment described above, the V-NPNTr was made of a so-called double polysilicon structure and the V-PNPTr was made of a so-called single polysilicon structure, but the invention is not limited to this structure.

In the manufacturing method of the complementary bipolar transistor 1, to suppress upward diffusion of the p$^+$-type collector region 54 of the V-PNPTr, which is a factor hindering the n-type epitaxial layer 43 being made thin, the step of forming the p$^+$-type collector region 54 is carried out in a step as far as possible behind the steps of which the heat-treatment conditions are generally considered to be the most severe.

That is, in the manufacturing method described above, which uses a p-type silicon substrate as the semiconductor base 11, first, the n-type embedded separation region 42 of the V-PNPTr was formed in this semiconductor base 11 after the n$^+$-type embedded collector region 41, and the p$^+$-type collector region 54 of the V-PNPTr was formed after the device separation region 49. Furthermore, the n-type embedded separation region 42, which must be formed in a particularly deep position, was formed by injecting an n-type impurity by high-energy ion injection, with which it is possible to set a projection range to deep into the semiconductor base 11.

By carrying out this kind of process, particularly upward diffusion of the p$^+$-type collector region 54 to the n-type epitaxial layer 43 side was suppressed. As a result, it was not necessary to preset the layer thickness of the n-type epitaxial layer 43 to an excess thickness. Therefore, in a complementary bipolar transistor 1 manufactured by the manufacturing method described above, the n-type epitaxial layer 43 constituting the collector layer of the V-NPNTr is of the minimum necessary thickness. Consequently, in the V-NPNTr, the Kirk effect is suppressed and high-speed operation is realized.

Also, because as a result of the reduction in the thickness of the n-type epitaxial layer 43 the need to divide the p$^+$-type device separation diffusion layers 55 constituting the channel stop diffusion layers into two upper/lower levels is eliminated, and here the number of ion injection steps is reduced by one.

If, as described above, the p$^+$-type collector region 54 of the V-PNPTr is formed at the same time as the ion injection step for forming the p$^+$-type device separation diffusion layer 55 of the V-NPNTr and the p$^+$-type graft base region 70 of the V-NPNTr and the collector takeout region 72 of the V-PNPTr are formed at the same time by a common diffusing step, even compared to a manufacturing process of an ordinary bipolar transistor, it is possible to keep the increase in the number of steps resulting from employing a complementary structure to a minimum.

Next, a preferred embodiment of the second mode of practicing the invention described above applied to a complementary bipolar transistor will be described with reference to the manufacturing process views of FIGS. 13A, 13B and FIGS. 14A and 14B. In the figures, constituent parts the same as those described with reference to FIG. 8A through FIG. 12 above have been given the same reference numbers.

Figure 13A:
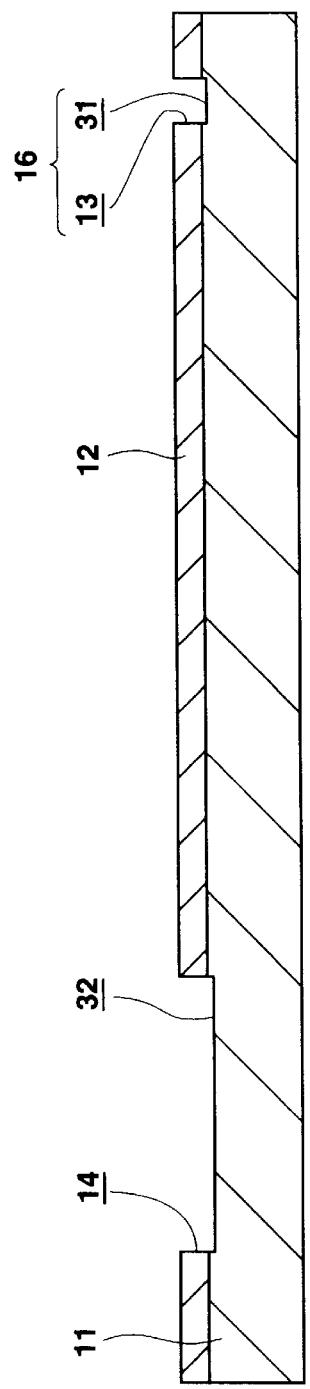
FIGS. 13A and 13B are (first) manufacturing process views of a preferred embodiment pertaining to the second mode of practicing the invention.

As shown in FIG. 13A, using for example a p-type silicon substrate as a semiconductor base 11, for example by thermal oxidation, an insulating film 12 made of silicon oxide (SiO$_2$) was formed on the semiconductor base 11 to a thickness of for example 330 nm.

Then, by a lithography technique and a dry etching technique, a first opening 13 and a second opening 14 were formed over a part to become an alignment mark used in exposure and over a region to become a collector region of a V-NPNTr. Also, the semiconductor base 11 was etched and a first concave part 31 and a second concave part 32 whose depth was about 50 nm were thereby formed in the semiconductor base 11. The first opening 13 and the first concave part 31 constitute an alignment mark 16.

The alignment mark 16 is determined by the exposure apparatus, and only one opening pattern is shown in these drawings, but normally it consists of for example a plurality of square opening patterns formed with a uniform spacing. This alignment mark 16 is not limited to the pattern shape described above, and needless to say is formed in a pattern of a shape matched to the type of the exposure apparatus.

Figure 13B:
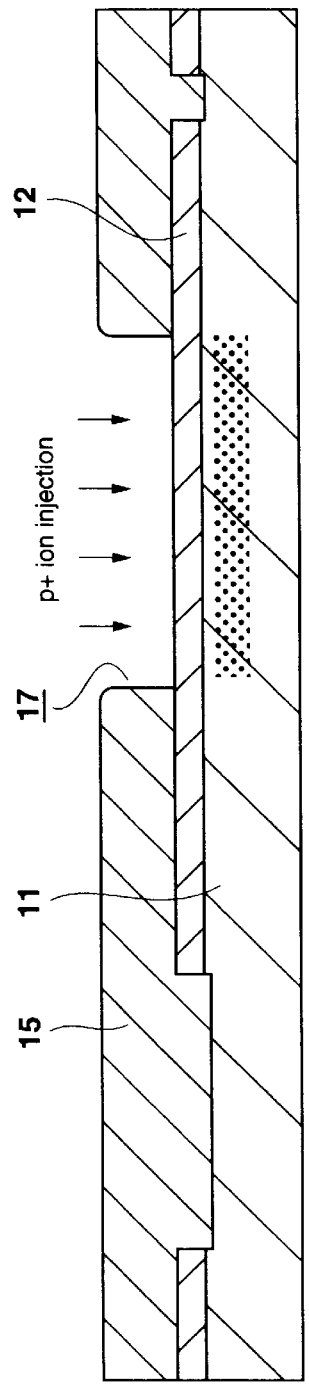

Next, by the same process as that described with reference to FIG. 8B, a doping mask 15 was formed with for example resist on the semiconductor base 11 in a state covering the insulating film 12, as shown in FIG. 13B. A third opening 17 was then formed in the doping mask 15 over a region where an embedded separation region of a V-PNPTr was to be formed.

Then, by ion injection using the doping mask 15, phosphorous (P$^+$) was injected into the semiconductor base 11 through the third opening 17 and through the insulating film 12. The conditions of the ion injection at this time are the same as those described with reference to FIG. 8B.

After that, the doping mask 15 was removed by ashing and cleaning treatment.

Figure 14A:
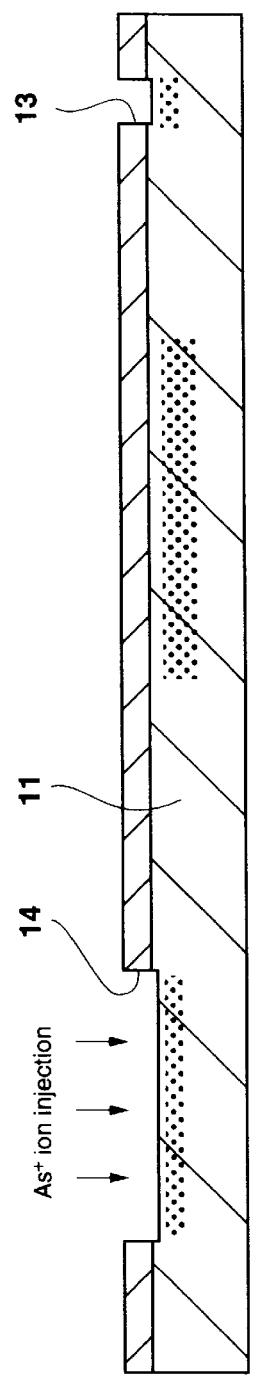
FIGS. 14A and 14B are (second) manufacturing process views of a preferred embodiment pertaining to the second mode of practicing the invention.

Then, as shown in FIG. 14A, by ion injection with the insulating film 12 as a mask, arsenic (As$^+$) was injected through the second opening 14 into a region in the semiconductor base 11 which was to become an n$^+$-type embedded collector region. At this time, arsenic (As$^+$) was also injected into the semiconductor base 11 through the first opening 13. As the conditions of this ion injection, for example the injection energy of the arsenic (As$^+$) was set to a predetermined value in the range 30 keV to 70 keV and the dose amount was set to a predetermined value in the range $1\times10^{15}$/cm$^2$ to $5\times10^{15}$/cm$^2$.

Figure 14B:
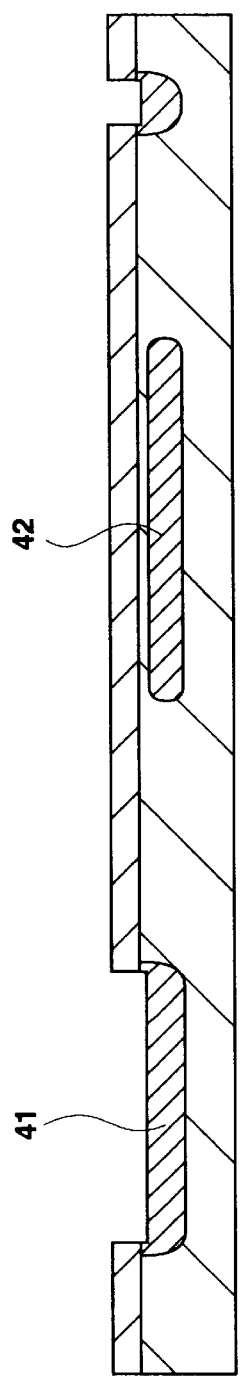

As shown in FIG. 14B, annealing was carried out in a temperature range of 950° C. to 1100° C. and in the range of 0.5 hours to 3 hours. As a result of this, the previously ion-injected arsenic (As$^+$) was diffused and an n$^+$-type embedded collector region 41 of the V-NPNTr was thereby formed. At the same time, as a result of the above-mentioned heat-treatment, the phosphorous (P$^+$) ion-injected into the n$^+$-type embedded separation region of the V-PNPTr was diffused and an n-type embedded separation region 42 was thereby formed.

In this ion injection, because the impurity is injected into a deep part of the semiconductor base 11, the impurity concentration in the surface vicinity of the semiconductor base 11 is kept low.

Then, by hydrofluoric (HF) wet etching, the insulating film 11 was removed.

Figure 15:
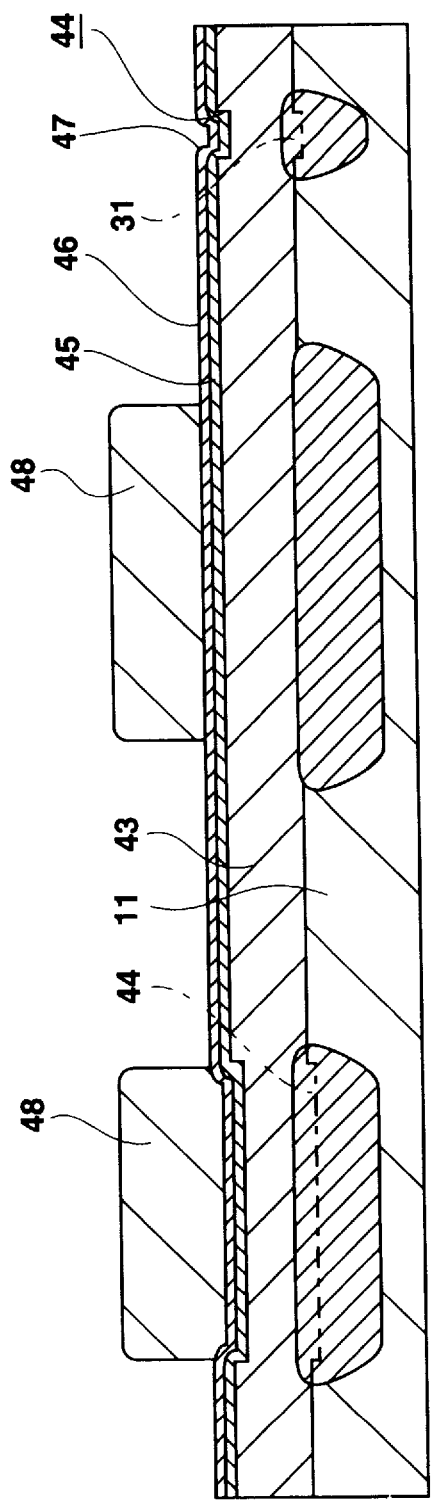
FIG. 15 is a (third) manufacturing process view of a preferred embodiment pertaining to the second mode of practicing the invention.

As shown in FIG. 15, by an existing epitaxial growth technique, an n-type epitaxial layer 43 is formed on the semiconductor base 11. This n-type epitaxial layer 43 was formed using the same conditions as those described with reference to FIG. 9B. In this epitaxial growth, because the first concave part 31 (shown with a broken line) was transferred to the surface of the n-type epitaxial layer 43, a concave part 44 was formed in the surface of the n-type epitaxial layer 43. The second concave part 32 (shown with a broken line) was also transferred to the surface of the n-type epitaxial layer 43.

Then, after a silicon oxide film 45 was formed on the surface of the n-type epitaxial layer 43 by thermal oxidation, a silicon nitride film 46 was formed to a thickness of for example 100 nm by CVD. In these film formations, on the concave part 44 a step of similar concave shape is formed and this step part becomes an alignment mark 47.

Using this alignment mark 47, by a lithography technique, a resist pattern 48 covering the active regions was formed. Then, using the resist pattern 48, the silicon nitride film 46 and the silicon oxide film 45 were patterned.

Then, by for example ashing and cleaning treatment, the resist pattern 48 was removed.

After that, although not shown here, the steps described with reference to the drawings FIG. 10A and on were carried out and a complementary bipolar transistor 1 was thereby completed.

In the above description, the n$^+$-type embedded collector region 41 was formed by ion injection, but it is also possible to form it for example by solid-phase diffusion using antimony oxide (Sb$_2$O$_3$), in the same way as described above with reference to FIG. 9A. As the solid-phase diffusion conditions of this case, for example, the atmosphere temperature was set to 1200° C. and the diffusion time was set to 1 hour.

In the preferred embodiment described with reference to FIG. 13A through FIG. 15, because the first opening 13 constituting the alignment mark 16 and the second opening 14 through which the impurity for forming the $n^+$-type embedded collector region 41 is introduced are formed in the insulating film 12 simultaneously, the step for forming the alignment mark 16 doubles as another step. Consequently, the number of steps is reduced. Also, because the semiconductor base 11 below the first opening 13 is dug into in making the alignment mark 16, the alignment mark 16 remains even after the insulating film 12 is removed.

Also, because doping of the impurity for forming the $n^+$-type embedded collector region 41 is carried out by ion injection, it is possible to use the insulating film 12 as an ion injection mask. Consequently, a step of forming a mask is eliminated.

Also, in the method wherein doping of the impurity for forming the $n^+$-type embedded collector region 41 is carried out by solid-phase diffusion, the impurity constituting the n-type embedded separation region 42 is diffused by the heat-treatment of the time of the solid-phase diffusion. Consequently, a heat-treating step for diffusing the impurity constituting the n-type embedded separation region 42 is eliminated.

As described above, according to the aspect of the invention wherein a first opening constituting an alignment mark and a second opening through which an impurity is introduced are formed simultaneously in an insulating film formed on a semiconductor base, a step of forming an alignment mark separately is not necessary. Consequently, the number of steps can be reduced.

Also, according to the aspect of the invention wherein a first embedded diffusion layer is formed by solid-phase diffusion, an impurity constituting a second embedded diffusion layer is caused to diffuse by heat-treatment of the time of the solid-phase diffusion. Consequently, it is possible to eliminate a heat-treating step for diffusing the impurity for forming the second embedded diffusion layer.

According to the aspect of the invention wherein the semiconductor base is dug into further than the first opening constituting the alignment mark in making the alignment mark, it is possible to leave an alignment mark even after the insulating film is removed. Consequently, it becomes possible to carry out formation of the first embedded diffusion layer by ion injection.

According to the aspect of the invention wherein the first embedded diffusion layer is formed by ion injection, because it becomes possible to use the insulating film as a mask, a step of forming a mask can be eliminated.

According to the aspect of the invention wherein after an epitaxial layer is formed in the surface of a semiconductor base in which are formed a first embedded diffusion layer and a second embedded diffusion layer and an oxide film is then formed on the epitaxial layer by selective thermal oxidation an impurity diffusion layer is formed in the epitaxial layer by ion injection having a projection range in this epitaxial layer, because high-temperature heat-treatment such that impurities greatly diffuse is completed before this impurity diffusion layer is formed, it is not necessary to make the epitaxial layer thick in consideration of upward diffusion of impurities. Consequently, the epitaxial layer can be formed thinner than in the past.

Also, according to the aspect of the invention wherein a device separation diffusion layer is formed in the epitaxial layer by the ion injection for forming an impurity diffusion layer, because two diffusion layers are formed with one ion injection, the number of steps can be reduced.

What is claimed is:

1. A semiconductor device manufacturing method comprising:

a first step of forming an insulating film on a semiconductor base and then forming a first opening in said insulating film above a region where an alignment mark is formed and at the same time forming a second opening in said insulating film above a region where a first embedded diffusion layer is to be formed;

a second step of forming on said semiconductor base a doping mask covering said insulating film and then with said first opening as an alignment mark forming a third opening in said doping mask by lithography using said alignment mask as a reference of alignment above a region where a second embedded infusion layer is to be formed;

a third step of doping an impurity forming said second embedded diffusion layer into said semiconductor base through said third opening and through said insulating film; and a fourth step of removing said doping mask and then forming said first embedded layer by doping an impurity into said semiconductor base through said second opening.

2. A semiconductor device manufacturing method according to claim 1 wherein:

doping of said impurity for forming said second embedded diffusion layer is carried out by ion injection; wherein the ions are projected to a depth having range of zero to 0.4 $\mu$m from the surface of said semiconductor base.

3. A semiconductor device manufacturing method according to claim 1 wherein:

doping of said impurity for forming said first embedded diffusion layer is carried out by solid-phase diffusion.

4. A semiconductor device manufacturing method comprising:

a first step of forming an insulating film on a semiconductor base and then forming a first opening in said insulating film above a region where an alignment mark is formed and at the same time forming a second opening in said insulating film above a region where a first embedded diffusion layer is to be formed and further forming a concave part by removing an upper layer portion of said semiconductor base under said first opening;

a second step of forming on said semiconductor base a doping mask covering said insulating film and then with said first opening as an alignment mark forming a third opening in said doping mask by lithography using said alignment mask as a reference of alignment above a region where a second embedded diffusion layer is formed;

a third step of doping an impurity for forming said second embedded diffusion layer into said semiconductor base through said third opening and through said insulating film; and a fourth step of removing said doping mask and then forming said first embedded diffusion layer by doping an impurity into said semiconductor base through said second opening.

5. A semiconductor device manufacturing method according to claim 4 wherein:

doping of said impurity for forming said first embedded diffusion layer is carried out by ion injection.

6. A semiconductor device manufacturing method according to claim 4 wherein:

doping of said impurity for forming said first embedded diffusion layer is carried out by solid-phase diffusion.

7. A semiconductor device manufacturing method comprising:

A. forming a concave pattern on the surface of a semiconductor base, wherein the surface of said concave pattern serves as an alignment mark, B. forming on said base semiconductor surface a first embedded diffusion layer and a second embedded diffusion layer, and an epitaxial layer of opposite conductive type to that of said semiconductor base;

C. of forming an impurity diffusion layer in said epitaxial layer by ion injection having a projection range in said epitaxial layer above said second embedded diffusion layer.

8. A semiconductor device manufacturing method according to claim 7 wherein:

a device separation diffusion layer is formed in said epitaxial layer by said ion injection for forming said impurity diffusion layer.

* * * * *